United States Patent [19]

Chu

[11] 3,921,095

[45] Nov. 18, 1975

[54] STARTABLE PHASE-LOCKED LOOP OSCILLATOR

[75] Inventor: David Chau-Kwong Chu, Woodside, Calif.

[73] Assignee: Hewlett-Packard Company, Palo Alto, Calif.

[22] Filed: Nov. 14, 1974

[21] Appl. No.: 523,631

[52] U.S. Cl. ...................... 331/1 A; 331/14; 331/25

[51] Int. Cl.$^2$ ........................................... H03B 3/04

[58] Field of Search .................. 331/1 A, 14, 18, 25

[56] References Cited

UNITED STATES PATENTS

| | | | |
|---|---|---|---|
| 3,619,804 | 11/1971 | Mears | 331/14 X |
| 3,638,135 | 1/1972 | Stover | 331/25 X |

*Primary Examiner*—Siegfried H. Grimm

*Attorney, Agent, or Firm*—Ronald E. Grubman

[57] ABSTRACT

A startable oscillator is provided whose frequency can be locked to a reference frequency and whose initial phase at the instant of start can be maintained indefinitely with a known precision. More particularly, the frequency of a tunable oscillator is locked to the reference frequency by means of a phase-locked loop. When a start signal is applied to the loop, the tunable oscillator is momentarily stopped and then restarted a fixed time later with a new phase as a result of the interruption. Simultaneously the inputs to a phase detector in the loop are withheld so that the phase detector will not produce any error correction signal to retune the frequency of the oscillator as a result of the change in oscillator phase. Large variations in the frequency of the tunable oscillator which would destroy the initial phase information are therefore avoided. Although the signals to the phase detector input are withheld from the phase detector, they are monitored and adjusted in phase. At an appropriate time at which the phases resemble the conditions prior to the start/restart interruption, the inputs are released to the phase detector. The phase detector thus experiences only locked conditions both before and after the restart. After the restart, however, the loop is locked at the new phase of the oscillator. The phase-locked loop thus behaves as though no interruption had occurred so that the tunable oscillator will continue operating at a frequency locked to the reference frequency but having the new phase preserved indefinitely.

6 Claims, 3 Drawing Figures

STARTABLE PHASE-LOCKED LOOP OSCILLATOR

BACKGROUND OF THE INVENTION

The invention is concerned generally with electronic oscillators and more particularly with a startable phase-locked loop oscillator circuit.

Startable oscillators are presently known which can be triggered to begin oscillation at a preset frequency and at a predictable phase, e.g., a phase relative to a trigger input signal. The frequency of these oscillators, however, is typically determined by circuit parameters which are subject to variation with temperature and other environmental factors. Thus, the frequency will vary with time and the initial phase information will eventually be lost. Furthermore, no two independent oscillators can be operated indefinitely at exactly the same frequency. Any frequency differences will integrate over time into large phase differences, initial phase information is thereby lost. It is also known in the art to precisely control the frequency of an oscillator by including it in a phase-locked loop with a very accurate standard reference frequency. In such a loop a phase detector essentially monitors the phase difference between the oscillator and the reference and generates a correction voltage more or less proportional to the difference. This correction signal is filtered and applied to the oscillator to maintain the oscillator frequency in a fixed relation to the reference frequency. Although the quiescent operating frequency of a startable oscillator as described above may be precisely controlled by means of such a phase-locked loop, it is still not possible to preserve the initial phase information. The initial phase information is destroyed in the frequency variations required to resynchronize the oscillator frequency to the reference frequency following the start pulse.

SUMMARY OF THE INVENTION

In accordance with the illustrated preferred embodiments the present invention provides an oscillator which may be started or restarted and will then oscillate at a preset frequency locked to a reference while maintaining indefinitely its initial phase to a predetermined precision. The oscillator is included in a phase-lock loop to maintain the oscillator frequency in a fixed relation to a reference frequency. In the preferred embodiments the oscillator frequency is hetrodyned with the reference frequency in a mixer. A phase detector compares the phase of the resulting beat frequency with the phase of another signal, e.g., a submultiple of the oscillator frequency, produced by a divide-by-N scaler. The detector generates an error signal responsive to phase differences which controls the frequency of the oscillator, thereby maintaining the oscillator frequency and the reference frequency in a fixed relation.

To establish an initial phase of the oscillator signal the oscillator is momentarily stopped and restarted. According to the invention, at the instant the oscillator is stopped the VCO is momentarily prevented from seeing perturbations at its input. This may be accomplished, e.g., by momentarily inhibiting both the beat frequency and the subharmonic of the oscillator frequency from presentation at the inputs of the phase detector while resetting and temporarily holding the scaler at a preset value. When the oscillator restarts, the phase of the beat output from the mixer immediately jumps to a new value to reflect the new phase relationship between the oscillator frequency and the reference frequency. In the ordinary phase-lock loop circuit the phase detector would respond to this new phase by generating an error signal which would induce large variations in the oscillator frequency. This variation would destroy the initial phase information. However, since the beat frequency has been inhibited from presentation to the phase detector, the phase detector will ignore the phase jump. Although the beat frequency is withheld from the phase detector, it is nevertheless monitored until the phase reaches that particular value which was matched to the scaler preset value under locked loop conditions. At this time both scaler frequency and beat frequency are released to the phase detector, so that normal phase-locked conditions are reestablished, but at the new phase of the startable oscillator. The phase detector is therefore prevented from being exposed to out-of-lock conditions beyond those found in the quiescent locked condition.

DESCRIPTION OF THE INVENTION

The invention may be best understood by first referring to the more usual phase-locked loop aspects of the device. These are described in the following paragraph. Subsequently, the novel aspects and operation of the present invention are discussed.

Figure 1:
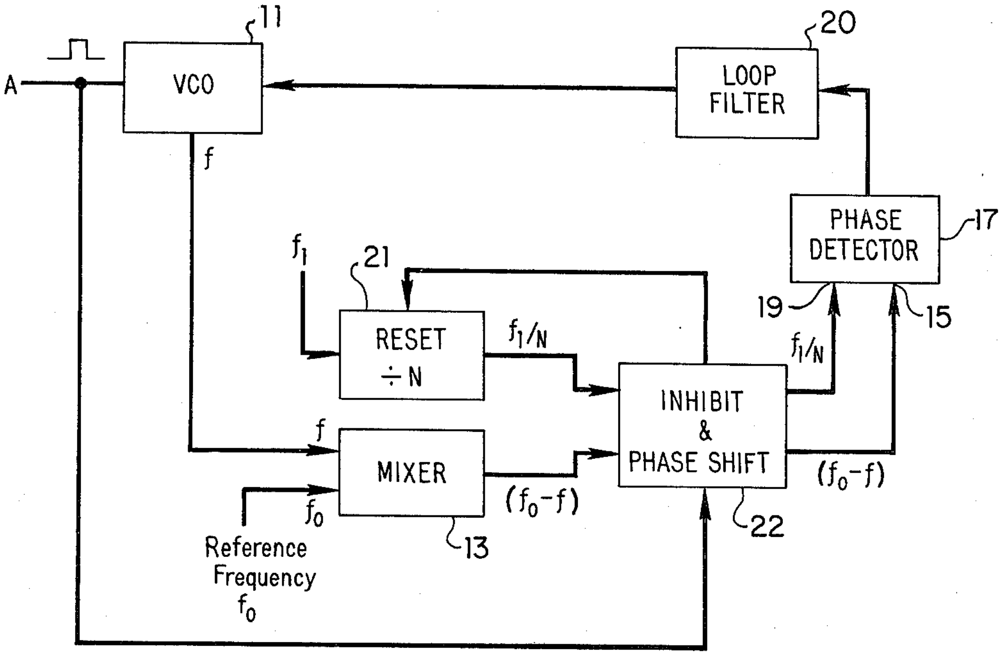
FIG. 1 is a block diagram of a startable oscillator circuit according to the invention.

In FIG. 1 there is shown a tunable oscillator 11 in a phase-locked loop. The oscillator may be, e.g., a voltage controlled oscillator (VCO) whose frequency can be controlled by means of a varying voltage input signal. Under quiescent conditions the oscillator frequency is locked to a reference frequency in the manner of an ordinary frequency synthesizer. More particularly, the output frequency from VCO 11 is fed into a mixer 13. The other input of mixer 13 is a reference frequency denoted $f_o$. The resulting beat frequency $(f_o - f)$ is directed to one input 15 of a phase detector 17. In preferred embodiments phase detector 17 is of a commonly-known type which monitors time differences between low-high transitions of two inputs to detect phase differences therebetween. The phase detector compares the phase of the input 15 with the phase of a second input 19 whose frequency is the output frequency of a frequency scaler or divider 21, which may comprise, e.g., a one-out-of-N counter which generates one pulse at its output for every N pulse presented at its input. According to well-known phase-locked loop techniques phase detector 17 compares the relative phases of inputs 15 and 19 and generates an error voltage in response to a detected phase difference. The error voltage is suitably filtered and processed by a loop filter 20, and thence varies the VCO frequency to thereby lock the frequency to the reference frequency. In a preferred embodiment (see e.g., FIG. 2) the input to divider 21 is the output of VCO 11 so that the output of divider 21 is a subharmonic of the VCO frequency. More generally, the divider input may be any frequency $f_1$. In the general case, and including the possibilities of harmonic mixing and mixing at either side-band, many different frequencies can be synthesized according to the relation $\pm(f_o - Mf) = f_1/N$ where $f$ is the synthesized frequency, $M$ is a harmonic number, and the sign choice refers to the two possible side bands.

In the particular embodiment to be discussed hereafter, $f_1$ is taken as equal to $f$ itself, no harmonic mixing is used ($M=1$), and the lower side-band (plus sign) is considered. In this case the VCO will lock to a frequency which is given by $f = N/N+1\ f_o$ and the beat is the simple difference $(f_o - f)$. In the more general case the beat refers to the intermediate frequency (IF) given by $\pm(f_o - Mf)$. It will be appreciated that the discussion related to this embodiment may be simply extended to the more general case.

Figure 2:
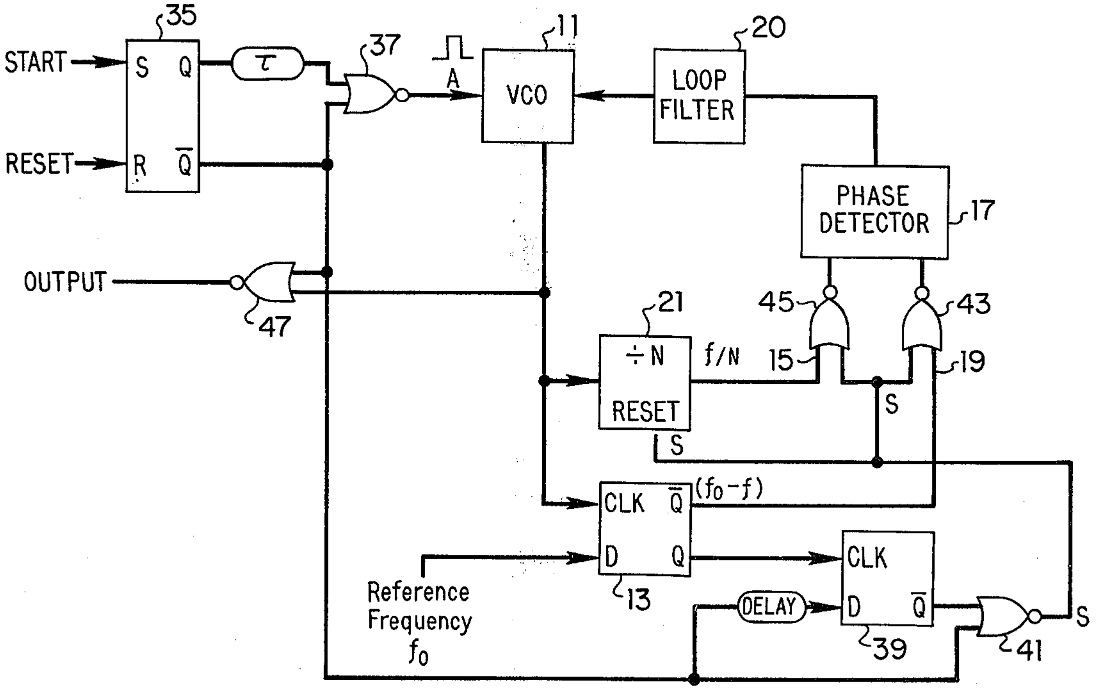
FIG. 2 illustrates in more detail a startable oscillator circuit according to the invention.
Figure 3:
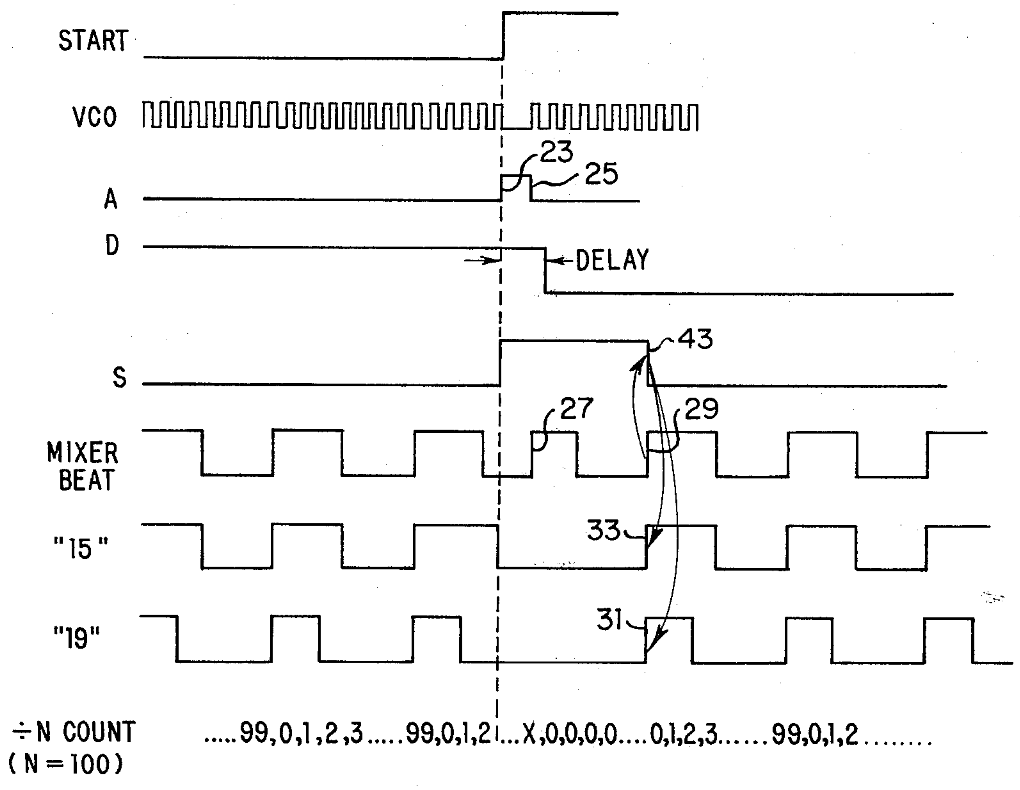
FIG. 3 shows a number of waveforms appearing in the circuits of FIGS. 1 and 2.

Operation of the device of FIG. 1 as a startable or restartable oscillator according to the invention may be best understood by reference now to the waveforms of FIG. 3. For purposes of discussion in connection with FIG. 1 only certain waveforms and portions thereof in FIG. 3 will be discussed. A more detailed description follows in connection with the circuit embodiment of FIG. 2. It is assumed for purposes of explanation that VCO 11 has already been started and is operating in a steady-state quiescent mode locked to the reference frequency $f_o$. A representation of the VCO waveform is shown in FIG. 3, and labeled "VCO". A representation of the beat frequency $(f_o - f)$ from mixer 13 is also shown, labeled "MIXER BEAT". It should be noted that the VCO frequency and the beat frequency of mixer 13 are not shown to scale; i.e., in actual practice there are many more cycles of VCO output per beat cycle than can be conveniently illustrated. Thus, the VCO time scale has been greatly expanded.

When it is desired to restart the oscillator, a signal pulse A is applied to the VCO. The leading edge 23 of signal pulse A operates to shut down VCO 11 momentarily. When the VCO output is halted, the mixer output is similarly shut down. Pulse A is also applied to an inhibit and phase shift circuit 22 (FIG. 1) whose function will be described in more detail below. For purposes of explanation it is sufficient to note that in response to leading edge 23 of pulse A inhibit circuit 22 temporarily prevents VCO 11 from seeing perturbations at its input. In a preferred embodiment inhibit circuit 22 accomplishes this result by blocking both the mixer beat output and the subharmonic output of divider 21 from being presented at phase detector 17; i.e., the input signals 15 and 19 are inhibited. At the same time, inhibit circuit 22 generates a reset signal which resets divider 21. Thus, for example, if divider 21 is a one-out-of-N counter which triggers once for every N input counts, the reset signal 25 may reset the count to zero or any other initial count. This is illustrated in the last row of FIG. 2 where the current count prior to the time of pulse A is denoted as "$x$", and the counter is reset and held at zero. At this point the loop is in a temporary hold condition.

A trailing edge 25 of pulse A reactivates VCO 11 which immediately begins oscillating with a new and definite phase relationship, e.g., with respect to the trailing edge of pulse A. In response to this signal mixer 13 produces a new beat signal whose phase corresponds to the new relative phase between the VCO signal and the reference frequency $f_o$. In FIG. 3, for example, there is illustrated a low-high transition 27 of the beat signal. This indicates that the new phase of the beat signal is somewhere along its high edge (i.e., the phase is in the range 0°–180°). However, since the beat phase corresponds to the new arbitrary relative phase between VCO signal and reference frequency, it could equally have been true that the phase would be somewhere along the low portion of the beat signal (i.e., 180°–360°). In that case there would have been no instantaneous low-high transition such as transition 27. For this reason we will refer to low-high transition 27 as an "artificial" low-high transition as distinguished from the subsequent regular low-high transitions of the beat frequency. As will be discussed in detail later, inhibit and phase shift circuit 22 ignores this artificial low-high transition should it occur. Instead, inhibit circuit 22 awaits the occurrence of the first "natural" low-high transition of the beat frequency, here labeled 29. In response to the first natural low-high signal 29, inhibit circuit 22 releases counter 21 which begins incrementing and generates a low-high transition 31 which is passed to input 19 of phase detector 17. Simultaneously, inhibit circuit 22 allows the beat frequency to be presented at input 15 of phase detector 17 in the form of a low-high transition labeled 33. Phase detector 17 is thus assured of seeing simultaneous low-high transitions at its inputs 15 and 19. Since these inputs are assured to be in phase, the detector will not generate any substantial error signal to VCO 11 which would have forced the VCO frequency to fluctuate and thereby destroy the initial phase of the VCO oscillator. After divider 21 is released it will again generate one pulse after a time equivalent to N counts. Since the frequency has been kept constant, the time for this occurrence will be almost the same as that required for the beat frequency to advance one period. Thus, subsequent low-high transitions at both phase detector inputs 15 and 19 will occur almost simultaneously. Any slight differences in time are of course translated into small error correcting signals for the VCO. In other words, the loop again reacquires the quiescent lock condition at the new VCO phase without ever experiencing a large out-of-lock condition. The new inputs to the phase detector are illustrated in the latter halves of the signal labeled 15 and 19 in FIG. 3. At this point, then, the oscillator has been successfully restarted in response to the trigger pulse A, and the initial phase information has been preserved. The VCO will therefore continue to oscillate at the phase-locked loop frequency with the new phase relationship maintained.

In FIG. 2 there is illustrated in more detail a preferred embodiment of the invention in which an oscillator frequency $f$ is locked to a reference frequency $f_o$ according to the relation $f = (N/N+1) f_o$. Operation of this embodiment will again be explained with reference to the waveforms of FIG. 3. The discussion above in connection with FIGS. 1 and 3 describes generally some operational features to be considered hereafter. The present explanation is thus to be read in view of the earlier discussion, and corresponding numerals will designate corresponding elements in the various figures.

Referring now to FIGS. 2 and 3, input signal pulse A is applied to oscillator 11 to momentarily stop and subsequently restart the oscillator. The signal pulse A (FIG. 3) may be derived; e.g., from a "start" signal applied to a flip-flop 35. In particular, upon application of a low-high transition to the set terminal of flip-flop 35 terminal Q goes low. NOR gate 37 consequently goes high to provide the leading edge 23 of pulse A. In response to this pulse the VCO is momentarily shut down. However, after a brief delay ($\tau$) the transition at terminal Q of flip-flop 35 is presented to NOR gate 37 which then generates a high-low transition serving as the trailing edge 25 of pulse A. The delay time between the pulses at Q and Q therefore defines the pulse width of pulse A.

Coincident with the start pulse, the high-low transition at Q of flip-flop 35 is presented at a NOR gate 41. The output of gate 41 is denoted S, and goes high at this time. The S signal is applied to one terminal of each of a pair of NOR gates 43 and 45 which have as their other inputs the mixer beat signal 19 and the subharmonic signal 15 respectively. When S goes high, these inputs to phase detector 17 are withheld. Simultaneously, the signal S is also applied to the reset terminal of divide-by-N counter 21 to reset and hold the counter at zero.

Meanwhile, trailing edge 25 of pulse A has arrived at VCO 11 and restarted the VCO. Mixer 13 immediately produces a beat frequency at a new phase dependent on the new relative phase between the VCO frequency and the reference frequency $f_0$. However, this phase is withheld from the phase detector by virtue of the high level S being applied to gates 43 and 45 as described immediately above. When the beat output of mixer 13 reaches a "natural" low-high transition (29 in FIG. 3) signifying that the VCO and reference frequencies are phase coincident, that transition is applied to the clock input of phase-coincident flip-flop 39. Flip-flop 39 will output a low-high transition at Q which will drive the output of gate 41 low; i.e., the voltage level S will exhibit a high-low transition (43 in FIG. 3). This transition 43 of voltage S restarts counter 21 producing the subharmonic frequency and also simultaneously enables gates 43 and 45 so that phase detector 17 will see the signals 15 and 19 which are both low at this point in time. These inputs will thus rise simultaneously. Phase detector 17 which monitors low-high transitions from both inputs accepts this as a satisfactory phase-lock condition and produces no significant correction signal at its output. Phase detector 17 therefore does not cause any large frequency variation of VCO 11 upon restart.

In the above discussion it has been assumed that the key voltage level S exhibits a high-low transition 43 only when mixer 13 exhibits a "natural" low-high transition 29, and not in response to an "artificial" low-high transition 27 which may be exhibited when the VCO is restarted and the mixer jumps to a new phase. To prevent this artificial low-high transition 27 of the mixer from changing the state of flip-flop 39 and therefore of gate 41 the invention provides that flip-flop 39 only be activated to transmit the mixer frequency after a certain time delay sufficient so that any artificial low-high transition will be ignored. This is accomplished by inserting a delay between flip-flop 39 and the signal from the original start pulse; i.e., the Q output of flip-flop 35 is delayed prior to being applied to input D of flip-flop 39. The delay is sufficiently long that any artificial low-high transition from Q of mixer 13 will occur before the appearance of the high-low transition at D of 39 which simply remains at a high state. Thus, the "artificial" transition 27 will be withheld from gate 41 while the first "natural" transition 29 will be transmitted and reenable the phase detector inputs and the counter 25 as previously described.

When the loop is restarted, the mixer and subharmonic signals will be in the same phase relationship relative to each other as before the interrupt, so the loop will act precisely as a standard frequency synthesizer in which the VCO frequency is locked to the reference frequency. However, the new phase of the VCO is preserved. The accuracy of this phase is limited by the ±1 count ambiguity of the divider and corresponds to ±360°/N for the embodiment shown.

Although the system has been described from the viewpoint of restarting the VCO after an initial operation period, the entire unit may also be operated as a startable oscillator simply by suppressing the initial output, e.g., by means of a gate 47. When a start signal appears at flip-flop 35, gate 47 is enabled and the VCO output will appear as an output locked in frequency to a reference signal and locked in phase to the start signal. The entire restart and relock sequence can be repeated by resetting flip-flops 35 and 39 to await a new start pulse.

I claim:

1. A phase-locked oscillator comprising:

frequency generating means for producing an output signal of a frequency responsive to the level of an input signal;

scaling means for producing a divided signal output having a pulse spacing equal to the total spacing of N pulses of a signal appearing at the input of the scaling means, where N is a predetermined integer;

mixing means responsive to the output signal of the frequency generating means and to a reference frequency for producing a beat signal output;

phase comparison means for comparing the phases of the divided signal output from the scaling means and the beat signal output from the mixing means and generating an error signal indicative of a phase difference therebetween, said error signal supplying the input signal to the frequency generating means to thereby vary the frequency of the output signal from the frequency generating means to lock this frequency in a fixed relation with the reference frequency;

restart means for generating a restart signal which momentarily shuts down and restarts the frequency generating means; and inhibit and phase shift means for responding to the restart signal by inhibiting the phase comparison means from causing perturbations in the input signal to the frequency generating means and altering the phase of the scaling means output to match a change in phase if any of the beat signal arising from the restart of the frequency generating means, and for reactivating the phase comparison means upon the occurrence of a predetermined phase in the beat signal output.

2. A phase-locked oscillator as in claim 1 wherein the inhibit and phase shift means is adapted for inhibiting the divided signal and the beat signal outputs from presentation at the input of the phase comparison means in response to the restart signal and altering the phase of the scaling means output to match a change in phase if any of the beat signal arising from the restart of the frequency generating means, and for reactivating the inputs to the phase comparison means upon the occurrence of a predetermined phase in the beat signal output.

3. A phase-locked oscillator as in claim 2 wherein the inhibit and phase shift means is operable for altering the phase of the scaling means output by resetting and holding the scaling means in response to the restart signal and releasing the scaling means upon the occurrence of a predetermined phase in the beat signal output.

4. A phase-locked oscillator as in claim 3 wherein:

said inhibit and reset means releases the scaling means and at the same time reenables the inputs to the phase comparison means in response to the first natural transition in the beat signal output of the mixing means after the frequency generating means has been restarted.

5. A startable phase-locked oscillator as in claim 2 wherein said inhibit and reset means comprises:

first gating means at the input of the phase comparison means for gating the divided signal output from the scaling means;

second gating means at the input of the phase comparison means for gating the beat signal output from the mixing means;

coincidence means for monitoring the beat signal output of the mixing means and generating a coincidence signal response to the occurrence of the first natural transition in the beat signal output after the frequency generating means has been restarted;

third gating means for generating an inhibit signal in response to the signal which momentarily shuts down the frequency generating means to inhibit the first and second gating means and reset the scaling means, and generating an enable signal in response to the coincidence signal from the coincidence means to enable the first and second gating means and restart the scaling means.

6. A phase-locked oscillator as in claim 1 wherein the scaling means is responsive to the output signal of the frequency generating means for producing a divided signal output whose frequency is a subharmonic of the frequency of the frequency generating means.

* * * * *

UNITED STATES PATENT AND TRADEMARK OFFICE

CERTIFICATE OF CORRECTION

PATENT NO. : 3,921,095

DATED : November 18, 1975

INVENTOR(S) : David Chau-Kwong Chu

It is certified that error appears in the above-identified patent and that said Letters Patent are hereby corrected as shown below:

Column 4, line 63, "Q" should read -- $\overline{Q}$ --;

Column 5, line 2, "Q and Q" should read -- Q and $\overline{Q}$ --; line 5, "Q" should read -- $\overline{Q}$ --; line 27, "Q" should read -- $\overline{Q}$ --; line 54, "Q" should read -- $\overline{Q}$ --.

Signed and Sealed this

*thirteenth* Day of *April 1976*

[SEAL]

*Attest:*

RUTH C. MASON
*Attesting Officer*

C. MARSHALL DANN
*Commissioner of Patents and Trademarks*